(12) United States Patent
Kaza et al.

(10) Patent No.: US 8,482,959 B2
(45) Date of Patent: Jul. 9, 2013

(54) METHOD OF PROGRAMMING, ERASING AND REPAIRING A MEMORY DEVICE

(75) Inventors: Swaroop Kaza, Sunnyvale, CA (US); Sameer Haddad, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/324,759

(22) Filed: Dec. 13, 2011

(65) Prior Publication Data
US 2012/0081983 A1   Apr. 5, 2012

Related U.S. Application Data

(62) Division of application No. 11/633,940, filed on Dec. 5, 2006, now Pat. No. 8,077,495.

(51) Int. Cl.
*G11C 11/00* (2006.01)
*G11C 11/36* (2006.01)

(52) U.S. Cl.
USPC ............................ 365/148; 365/163; 365/175

(58) Field of Classification Search
USPC .......................................... 365/148, 163, 175
See application file for complete search history.

(56) References Cited

U.S. PATENT DOCUMENTS

| | | | | |
|---|---|---|---|---|
| 6,873,538 B2 * | 3/2005 | Hush | | 365/148 |
| 7,154,769 B2 * | 12/2006 | Krieger et al. | | 365/148 |
| 7,233,515 B2 * | 6/2007 | Rohr | | 365/148 |
| 7,233,520 B2 * | 6/2007 | Daley | | 365/163 |
| 7,257,014 B2 * | 8/2007 | Symanczyk | | 365/148 |
| 7,259,983 B2 * | 8/2007 | Bill et al. | | 365/163 |
| 7,269,050 B2 | 9/2007 | Kaza et al. | | |
| 7,286,388 B1 * | 10/2007 | Chen et al. | | 365/148 |
| 7,289,351 B1 * | 10/2007 | Chen et al. | | 365/148 |
| 7,327,602 B2 * | 2/2008 | Kostylev et al. | | 365/163 |
| 7,450,416 B1 * | 11/2008 | Kaza et al. | | 365/175 |
| 7,564,708 B2 * | 7/2009 | Fang et al. | | 365/148 |
| 7,646,624 B2 * | 1/2010 | Fang et al. | | 365/148 |
| 2006/0256608 A1 | 11/2006 | Chen et al. | | |

* cited by examiner

*Primary Examiner* — Trong Phan

(57) ABSTRACT

A method of repairing a memory device is provided. If an erase process is unsuccessful, a repair process is performed. A programmed state of the memory device is determined, A subsequent erase process dependent on the programmed state is performed. Also, a method of programming and erasing a memory device is provided. The memory device includes first and second electrodes and a switching layer therebetween. A first on-state resistance characteristic of the memory device is provided in programming the memory device by application of a first voltage to the gate of a transistor in series with the memory device. Other on-state resistance characteristics of the memory device, different from the first on-state resistance characteristic, may be provided by application of other voltages, different from the first voltage, to the gate of the transistor.

20 Claims, 9 Drawing Sheets

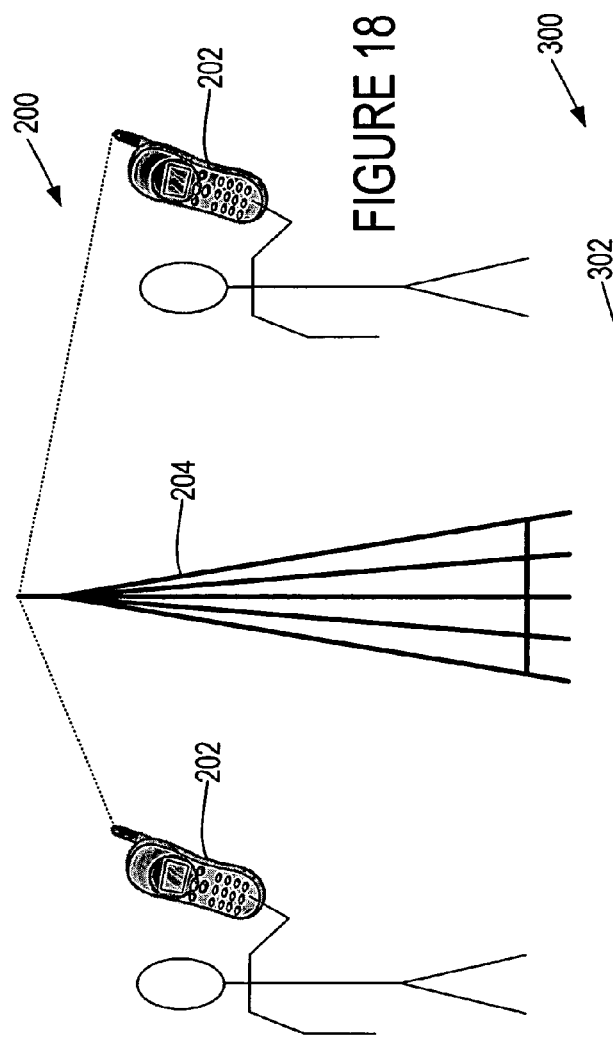
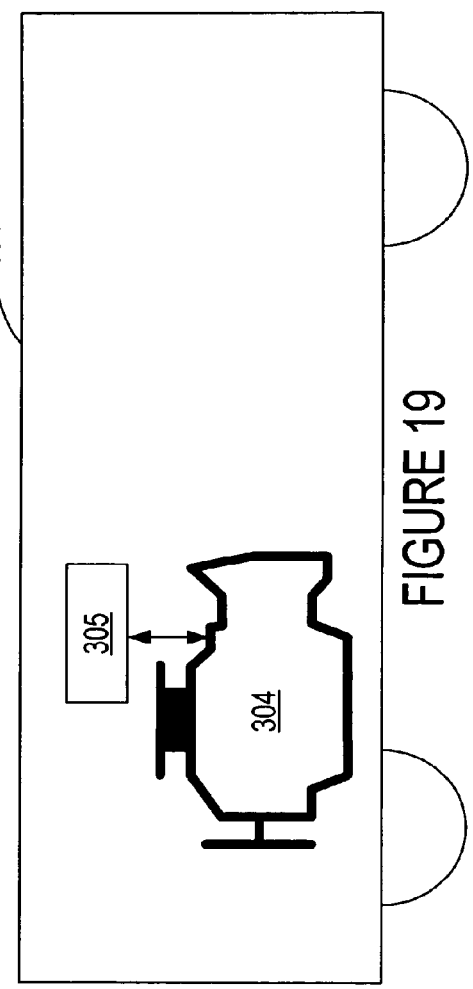
FIGURE 18
FIGURE 19

METHOD OF PROGRAMMING, ERASING AND REPAIRING A MEMORY DEVICE

CROSS-REFERENCE TO RELATED APPLICATIONS

This application is a Divisional of and claims priority to U.S. patent application Ser. No. 11/633,940, filed on Dec. 5, 2006, and now issued as U.S. Pat. No. 8,077,495, which is hereby incorporated by reference in its entirety.

FIELD

This invention relates generally to memory devices, and more particularly, to a method of programming, erasing and repairing the state of a metal-insulator-metal (MIM) memory device.

BACKGROUND

FIG. 1 illustrates a memory device 30 known as a metal-insulator-metal (MIM) device which includes an electrode 32, an insulating layer 34 (also known as a switching layer) on and in contact with the electrode 32, and an electrode 36 on and in contact with the insulating layer 32, so the insulating layer 34 is between the electrodes 32, 36 (it will be understood that while the electrodes are indicated as metal in the metal-insulator-metal nomenclature, the electrodes can be of any suitable conductive material). The electrode 32 is connected to the drain of an MOS transistor 38, while the source of the transistor 38 is connected to ground, so that the memory device 30 and transistor 38 are in series.

Initially, assuming that the memory device 30 is unprogrammed, in order to program the memory device 30, a programming voltage $V_{pg}$ is applied to the electrode 36, so that an electrical potential is applied across the memory device 30 from a higher to a lower potential in the direction from electrode 36 to electrode 32, (see FIG. 2, a plot of memory device current (I) vs. voltage (V) applied to the electrode 36 of the memory device 30). This voltage $V_{pg}$ is sufficient to cause charge carriers to be moved into the insulating layer 34, causing the insulating layer 34 (and the overall memory device 30) to rapidly switch to a low-resistance or conductive state (A). Upon removal of such potential, the charge carriers moved into the insulating layer 34 during the programming step remain therein, so that the insulating layer 34 (and memory device 30) remain in a conductive or low-resistance state, as indicated by the on-state resistance characteristic (B). The voltage $V_{ga}$ applied to the gate of the transistor 38 determines the magnitude of current through the memory device 30 during the programming step.

In order to erase the memory device 30, a positive voltage $V_{er}$ is applied to the electrode 36, so that an electrical potential is applied across the memory device 30 from a higher to a lower electrical potential in the same direction as in programming the device 30. This potential $V_{er}$ is sufficient to cause charge carriers to move from the insulating layer 34, in turn causing the insulating layer 34 (and the overall memory device 30) to be in a high-resistance or substantially non-conductive state. This state remains upon removal of such potential from the memory device 30. The gate voltage $V_{gb}$ again determines the magnitude of current through the memory device 30. As illustrated, the erase voltage $V_{er}$ is lower than the programming voltage $V_{pg}$, and the current provided through the memory device 30 during the erase step (C) is higher than the current through the device 30 during the programming step (based on a higher gate voltage during the erase step than during the programming step).

FIG. 2 also illustrates the read step of the memory device 30 in its programmed (conductive) state and in its erased (nonconductive) state. A voltage $V_r$ is applied to the electrode 36 so that an electrical potential across the memory device 30 from a higher to a lower electrical potential in the same direction as in the programming and erase steps. This voltage $V_r$ is lower than the voltage $V_{pg}$ applied for programming and is lower than the voltage $V_{er}$ applied for erasing (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

As will be seen, the memory device 30 as thus far shown and described is capable of adopting two states, i.e., a first, conductive state, or "on" state, and a second, substantially non-conductive, or "off" state. The memory device 30 thus can include information as to the state of a single bit, i.e., either 0 or 1. However, it would be highly desirable to be able to provide a memory device which is capable of adopting any of a plurality of states, so that, for example, in the case where four different states of the memory device can be adopted, two bits of information can be provided as chosen (for example first state equals 00, second state equals 01, third state equals 10, fourth state equals 11).

Therefore, what is needed is an approach wherein a memory device may adopt each of a plurality of states, each relating to the information held thereby.

SUMMARY

Broadly stated, the present method is a method of undertaking a procedure on a memory device, the memory device comprising first and second electrodes and a switching layer between the first and second electrodes, the method comprising providing current through the memory device, the on-state resistance characteristic of the programmed memory device being dependent on the magnitude of current through the memory device.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings, which are incorporated in and form a part of this specification, illustrate embodiments, together with the description, serve to explain the principles of the disclosure.

FIGS. 18-20 are systems incorporating memory devices of the present type.

DETAILED DESCRIPTION

Reference will now be made in detail to embodiments, examples of which are illustrated in the accompanying drawings. While the disclosure will be described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

Figure 1:
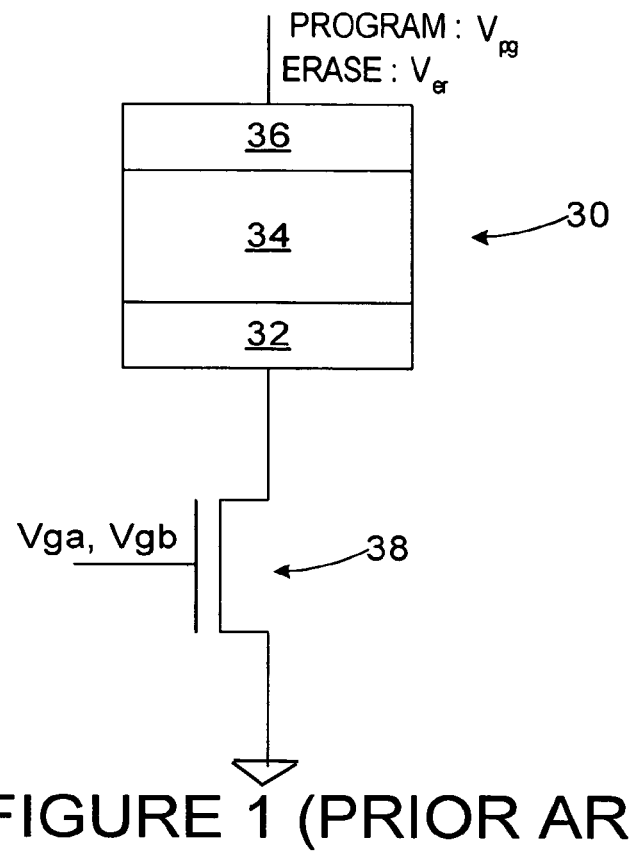
FIG. 1 is a cross-sectional view of the memory device as described above.
Figure 2:
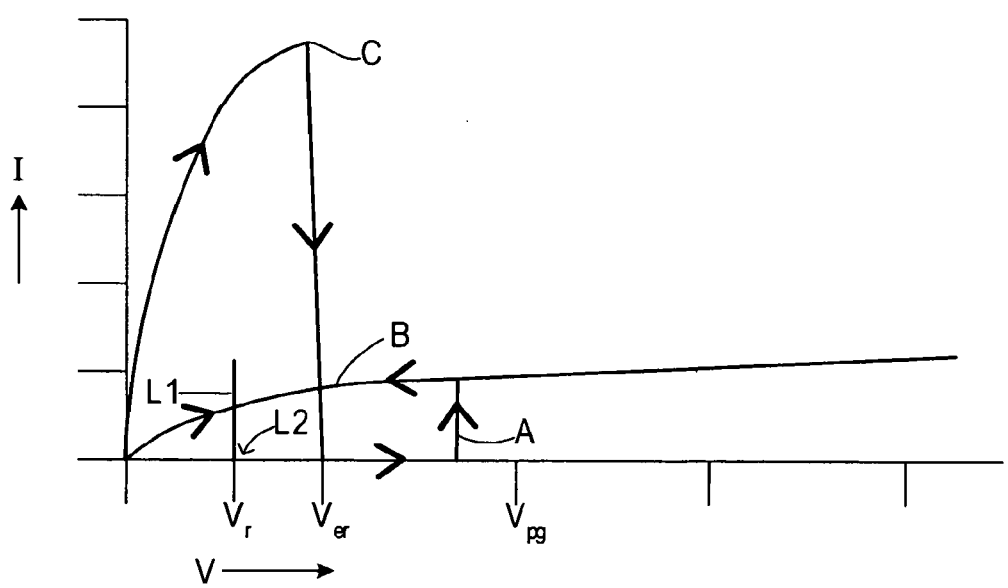
FIG. 2 is a plot of current (I) vs. voltage (V) in the programming, reading and erasing of the memory device of FIG. 1.
Figure 3:
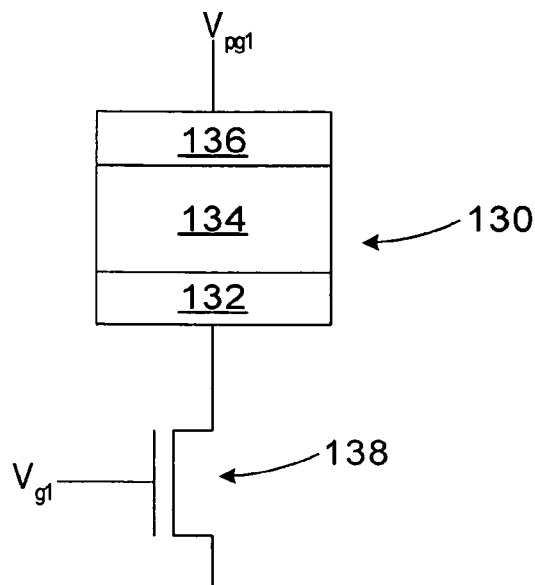
FIG. 3 is a cross-sectional view of the present memory device, illustrating programming thereof under a first set of programming conditions.

FIG. 3 illustrates a memory device of the type generally described above. The particular embodiment of memory device 130, i.e., a metal-insulator-metal (MIM) device 130, includes a copper electrode 132, a $CuO_x$ insulating layer 34 (also known as a switching layer) on and in contact with the electrode 132, and a Ni electrode 136 on and in contact with the insulating layer 132, so the insulating layer 134 is between the electrodes 132, 136 (it will be understood that while the electrodes are indicated as metal in the metal-insulator-metal nomenclature, the electrodes can be of any suitable conductive material). The electrode 132 is connected to the drain of an MOS transistor 138, while the source of the transistor 138 is connected to ground, so that the memory device 130 and transistor 138 are in series.

Figure 5:
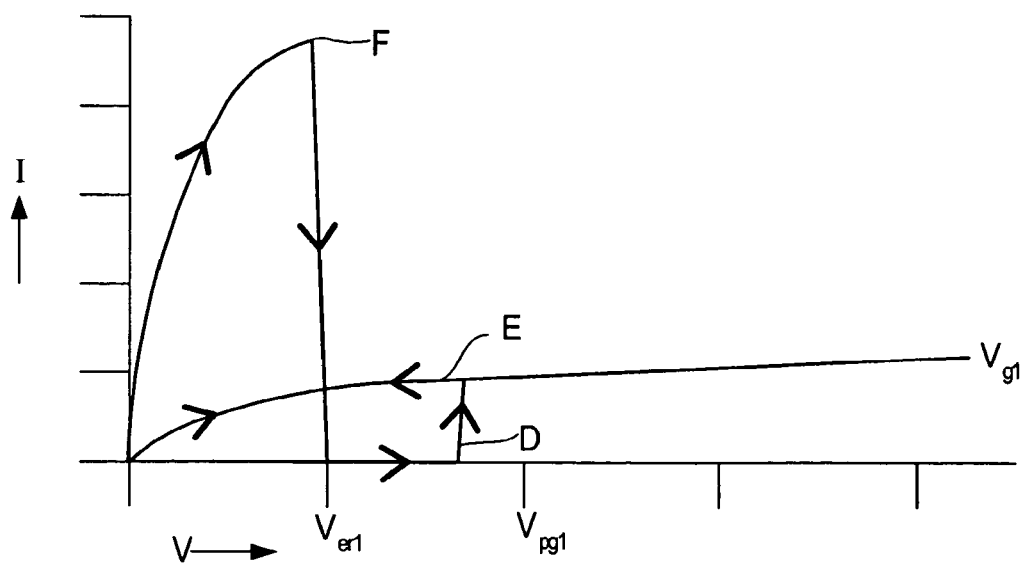
FIG. 5 is a plot of current (I) vs. voltage (V) illustrating the approaches of FIGS. 3 and 4.

Assuming that the memory device 130 is unprogrammed, in order to program the memory device 130 (see FIGS. 3 and 5, a plot of memory device current (I) vs. voltage (V) applied to the electrode 136 of the memory device 130), a programming voltage $V_{pg1}$ (in this example 2.0 volts) is applied to the electrode 136, so that an electrical potential is applied across the memory device 130 from a higher to a lower potential in the direction from electrode 136 to electrode 132. Meanwhile, a selected voltage $V_{g1}$, in this example 1.0 volts, is applied to the gate of the transistor 138. This procedure (graphically illustrated in FIG. 5) causes charge carriers in the form of electrons and/or holes to be moved into the insulating layer 134, causing the insulating layer 134 (and the overall memory device 130) to rapidly switch (D) to a low-resistance or conductive state (E). Upon removal of such potential, the charge carriers moved into the insulating layer 134 during the programming step remain therein, so that the insulating layer 134 (and memory device 130) remain in a conductive or low-resistance state, as indicated by the on-state resistance characteristic (E).

Figure 4:
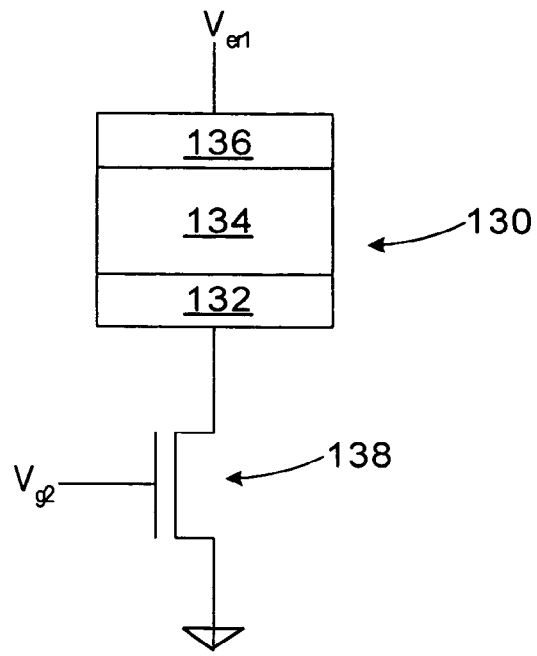
FIG. 4 is a cross-sectional view of the present memory device, illustrating erasing thereof under a first set of erase conditions.

In order to erase the memory device 130 (FIGS. 4 and 5), a positive voltage $V_{er1}$ (in this example 1.0 volts) is applied to the electrode 136, so that an electrical potential is applied across the memory device 130 from a higher to a lower electrical potential in the same direction as in programming the device 130. Meanwhile, a selected voltage $V_{g2}$, in this example 1.8 volts is applied to the gate of the transistor 138. This procedure causes charge carriers to be moved from the insulating layer 134, causing the insulating layer 134 (and the overall memory device 130) to rapidly switch to a high-resistance state. The higher gate voltage $V_{g2}$ in the erase step (as compared to gate voltage $V_{g1}$ in the programming step) provides substantially higher current (F) through the device 130 during the erase step than during the programming step. This provision of higher current during the erase step as compared to the programming step (based on the higher voltage applied to the gate of the transistor 138 for erase compared to programming, i.e., 1.8 volts versus 1.0 volts) provides an efficient erasing of the memory device 130.

Figure 6:
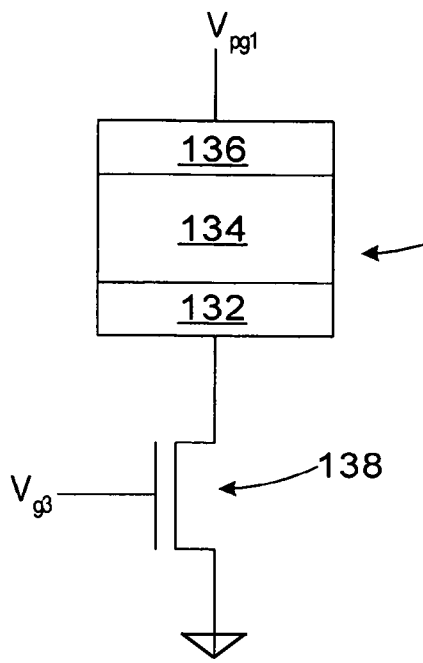
FIG. 6 is a cross-sectional view of the present memory device, illustrating programming thereof under a second set of programming conditions.
Figure 7:
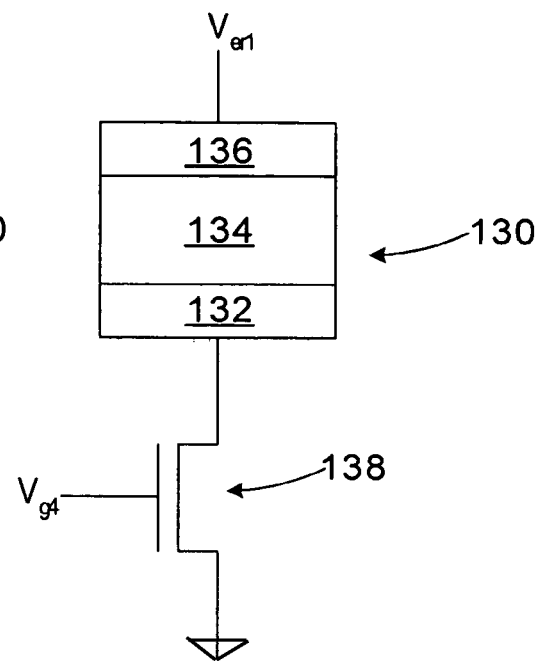
FIG. 7 is a cross-sectional view of the present memory device, illustrating erasing thereof under a second set of erase conditions.
Figure 8:
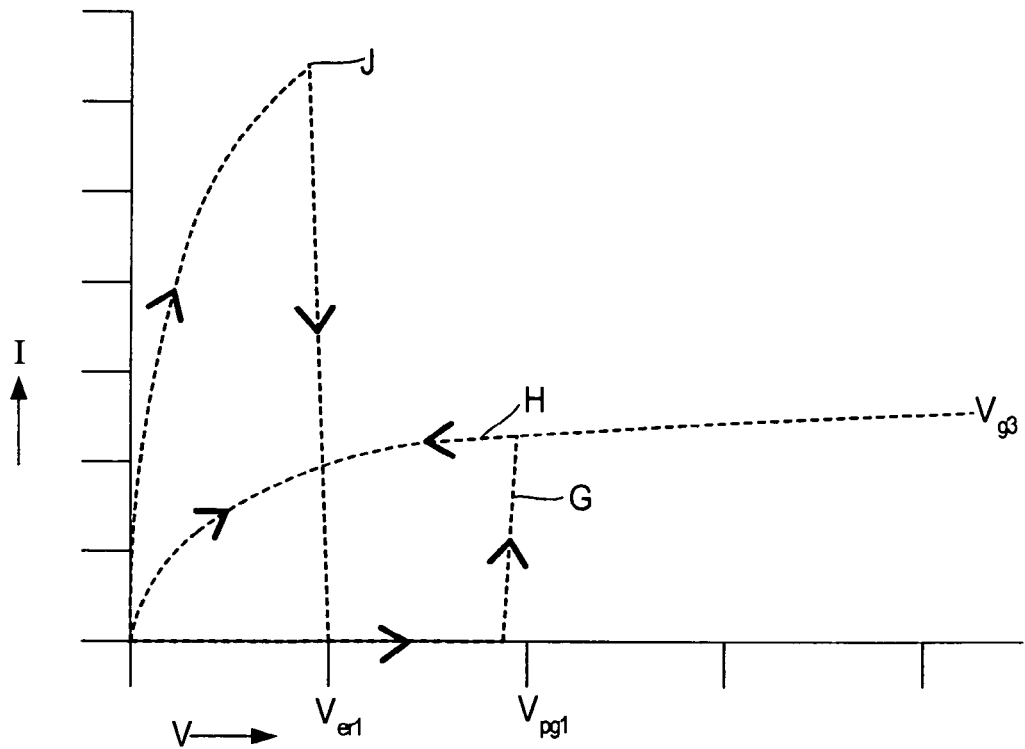
FIG. 8 is a plot of current (I) vs. voltage (V) illustrating the approaches of FIGS. 6 and 7.

FIGS. 6-8 illustrate a further approach in programming and erasing the memory device 130. Again assuming that the memory device 130 is unprogrammed, in order to program the memory device 130 (FIGS. 6 and 8), a programming voltage $V_{pg1}$ (in this example 2.0 volts, the same as in the approach of FIGS. 3-5) is applied to the electrode 136, so that an electrical potential is applied across the memory device 130 from a higher to a lower potential in the direction from electrode 136 to electrode 132. Meanwhile, a selected voltage $V_{g3}$, in this example 1.2 volts, is applied to the gate of the transistor 138 (see FIG. 8). This procedure (illustrated in FIG. 8) causes charge carriers in the form of electrons and/or holes to be moved into the insulating layer 134, causing the insulating layer 134 (and the overall memory device 130) to rapidly switch (G) to a low-resistance or conductive state (H). Upon removal of such potential, the charge carriers moved into the insulating layer 134 during the programming step remain therein, so that the insulating layer 134 (and memory device 130) remain in a conductive or low-resistance state, as indicated by the on-state resistance characteristic (H).

In order to erase the memory device 130 (FIGS. 7 and 8), a positive voltage $V_{er1}$ (in this example 1.0 volts, the same as in the approach of FIGS. 3-5) is applied to the electrode 136, so that an electrical potential is applied across the memory device 130 from a higher to a lower electrical potential in the same direction as in programming the device 130. Meanwhile, a selected voltage $V_{g4}$, in this example 2.0 volts, is applied to the gate of the transistor 138. This procedure causes charge carriers to be moved from the insulating layer 134, causing the insulating layer 134 (and the overall memory device 130 (to rapidly switch to a high-resistance state. The higher gate voltage $V_{g4}$ in the erase step (as compared to gate voltage $V_{g3}$ in the programming step) provides that substantially higher current (J) during the erase step than during the programming step. This provision of higher current during the erase step as compared to the programming step (based on the higher voltage applied to the gate of the transistor for erase compared to programming, i.e., 2.0 volts versus 1.2 volts) provides an efficient erasing of the memory device 130.

Figures 9, 10:
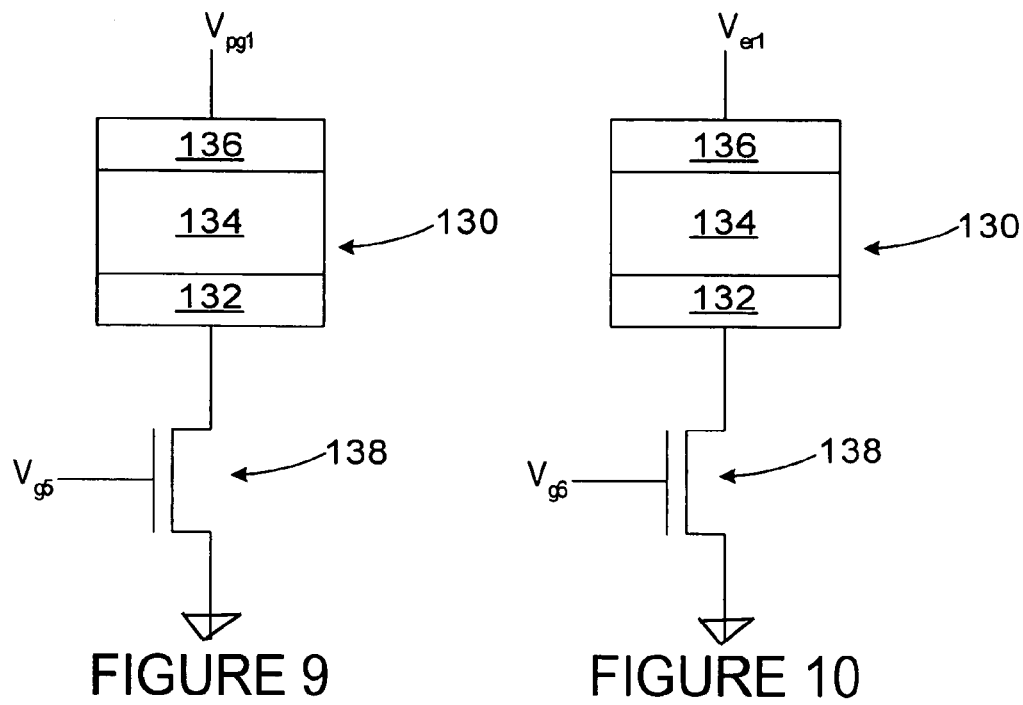
FIG. 9 is a cross-sectional view of the present memory device, illustrating programming thereof under a third set of programming conditions.
FIG. 10 is a cross-sectional view of the present memory device, illustrating erasing thereof under a third set of erase conditions.
Figure 11:
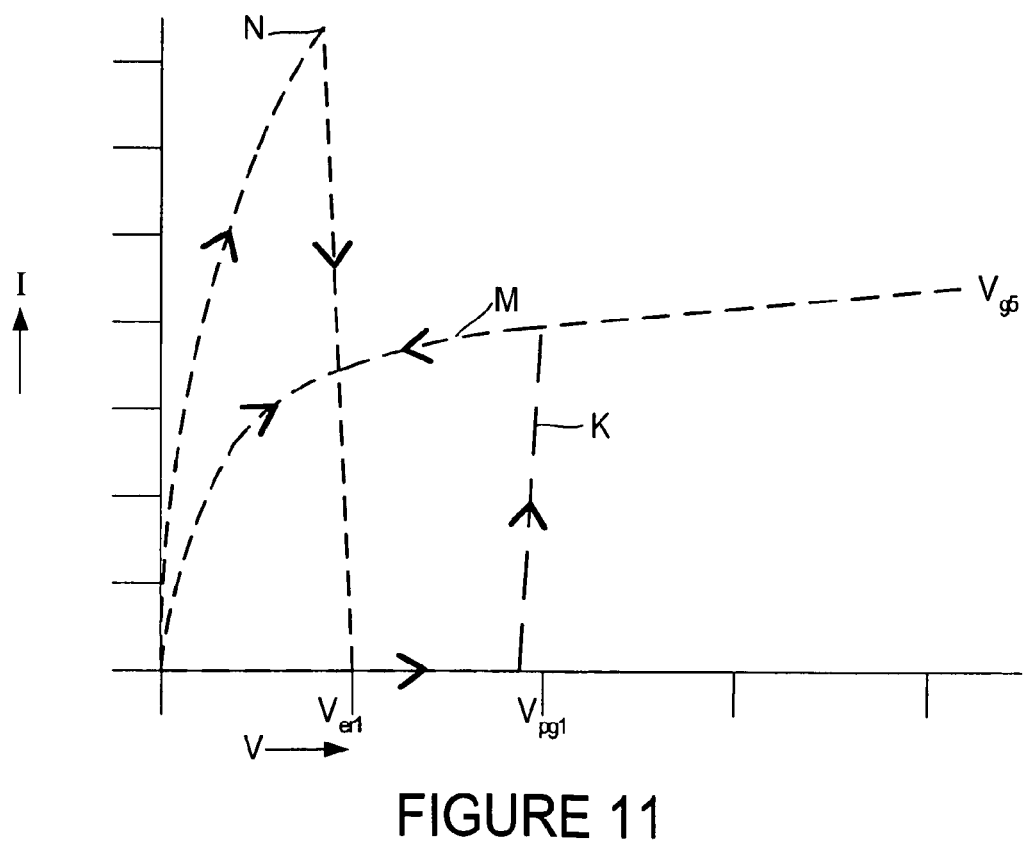
FIG. 11 is a plot of current (I) vs. voltage (V) illustrating the approaches of FIGS. 9 and 10.

FIGS. 9-11 illustrate yet a further approach in programming and erasing the memory device 130. Again assuming that the memory device 130 is unprogrammed, in order to program the memory device 130 (FIGS. 9 and 11), a programming voltage $V_{pg1}$ (in this example 2.0 volts, the same as in the approaches of FIGS. 3-5 and FIGS. 6-8) is applied to the electrode 136, so that an electrical potential is applied across the memory device 130 from a higher to a lower potential in the direction from electrode 136 to electrode 132. Meanwhile, a selected voltage $V_{g5}$, in these example 1.5 volts, is applied to the gate of the transistor 138 (see FIG. 11). This procedure (illustrated in FIG. 11) causes charge carriers in the form of electrons and/or holes to be moved into the insulating layer 134, causing the insulating layer 134 (and the overall memory device 130) to rapidly switch (K) to a low-resistance or conductive state (M). Upon removal of such potential, the charge carriers moved into the insulating layer 134 during the programming step remain therein, so that the insulating layer 134 (and memory device 130) remain in a conductive or low-resistance state, as indicated by the on-state resistance characteristic (M).

In order to erase the memory device 130 (FIGS. 10 and 11), a positive voltage $V_{er1}$ (in this example 1.0 volts, the same as in the approaches of FIGS. 3-5 and FIGS. 6-9) is applied to the electrode 136, so that an electrical potential is applied across the memory device 130 from a higher to a lower electrical potential in the same direction as in programming the device 130. Meanwhile, a selected voltage $V_{g6}$, in this example 2.3 volts, is applied to the gate of the transistor 138. This procedure causes charge carriers to be moved from the insulating layer 134, causing the insulating layer 134 (and the overall memory device 130) to rapidly switch to a high-resistance state. The higher gate voltage $V_{g6}$ in the erase step (as compared to gate voltage $V_{g5}$ in the programming step) provides that substantially higher current (N) during the erase step than during the programming step. This provision of higher current during the erase step as compared to the programming step (based on the higher voltage applied to the gate of the transistor for erase compared to programming, i.e., 2.3 volts versus 1.5 volts) provides an efficient erasing of the memory device 130.

Figures 12, 13:
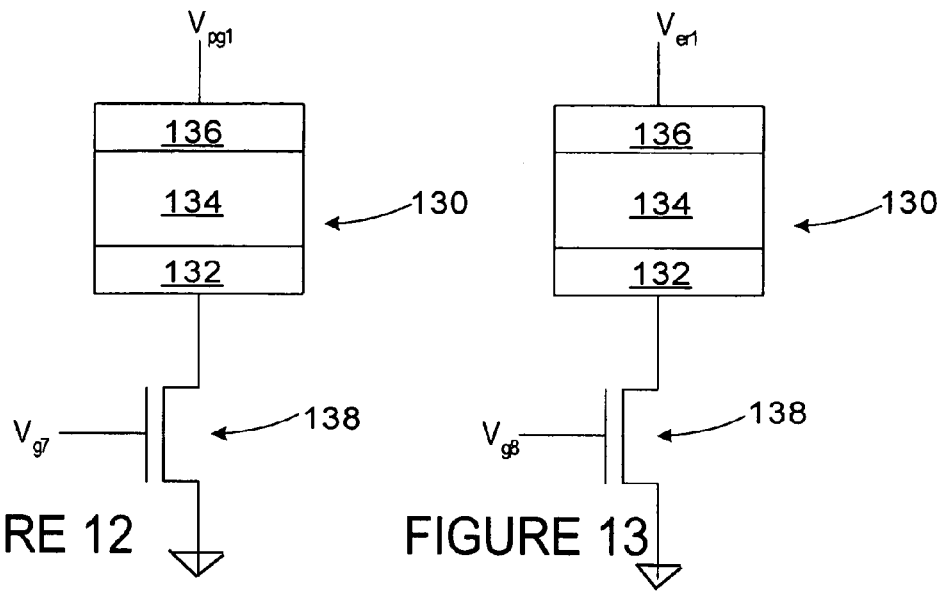
FIG. 12 is a cross-sectional view of the present memory device, illustrating programming thereof under a fourth set of programming conditions.
FIG. 13 is a cross-sectional view of the present memory device, illustrating erasing thereof under a fourth set of erase conditions.
Figure 14:
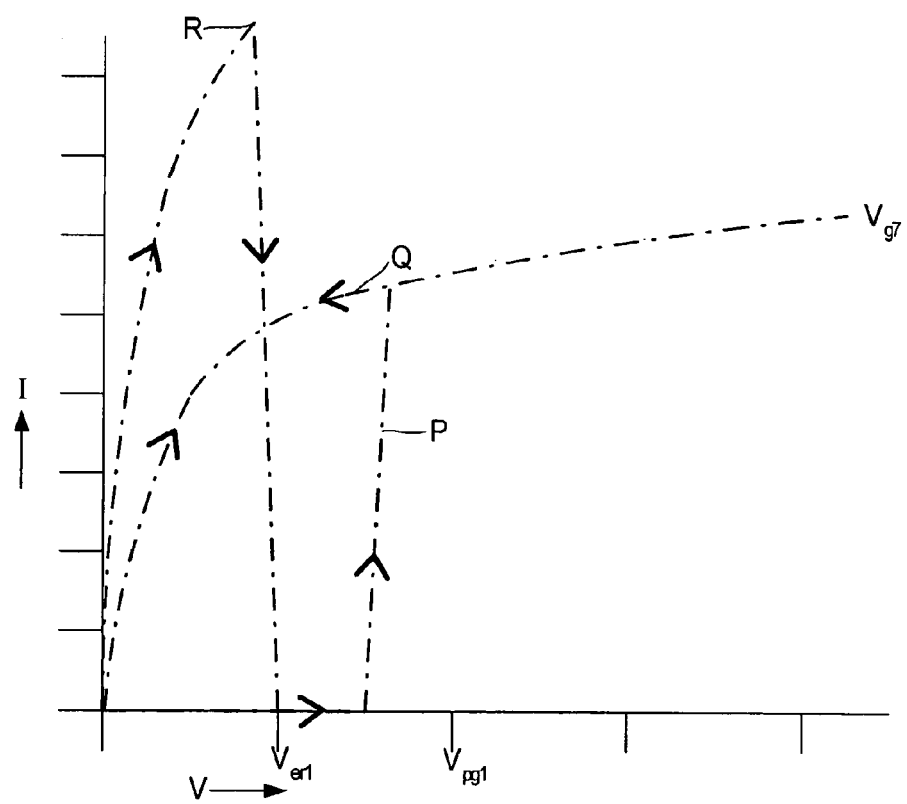
FIG. 14 is a plot of current (I) vs. voltage (V) illustrating the approaches of FIGS. 12 and 13.

FIGS. 12-14 illustrate yet a further approach in programming and erasing the memory device 130. Again assuming that the memory device 130 is unprogrammed, in order to program the memory device 130 (FIGS. 12 and 14), a programming voltage $V_{pg1}$ (in this example 2.0 volts, the same as in the previous embodiments) is applied to the electrode 136, so that an electrical potential is applied across the memory device 130 from a higher to a lower potential in the direction from electrode 136 to electrode 132. Meanwhile, a selected voltage $V_{g7}$, in this example 1.8 volts, is applied to the gate of the transistor 138 (see FIG. 14). This procedure (illustrated in FIG. 14) causes charge carriers in the form of electrons and/or holes to be moved into the insulating layer 134, causing the insulating layer 134 (and the overall memory device 130) to rapidly switch (P) to a low-resistance or conductive state (Q). Upon removal of such potential, the charge carriers moved into the insulating layer 134 during the programming step remain therein, so that the insulating layer 134 (and memory device 130) remain in a conductive or low-resistance state, as indicated by the on-state resistance characteristic (Q).

In order to erase the memory device 130 (FIGS. 13 and 14), a positive voltage $V_{er1}$ (in this example 1.0 volts, the same as in the previous approaches) is applied to the electrode 136, so that an electrical potential is applied across the memory device 130 from a higher to a lower electrical potential in the same direction as in programming the device 130. Meanwhile, a selected voltage $V_{g8}$, in this example 2.7 volts, is applied to the gate of the transistor 138. This procedure causes charge carriers to be moved from the insulating layer 134, causing the insulating layer 134 (and the overall memory device 130) to rapidly switch to a high-resistance state. The higher gate voltage $V_{g8}$ in the erase step (as compared to gate voltage $V_{g7}$ in the programming step) provides that substantially higher current (R) during the erase step than during the programming step. This provision of higher current during the erase step as compared to the programming step (based on the higher voltage applied to the gate of the transistor for erase compared to programming, i.e., 2.7 volts versus 1.8 volts) provides an efficient erasing of the memory device 130.

It will be seen that the on-resistance characteristics (E, H, M, Q) in the various approaches described above are different from each other. The particular determined on-resistance characteristic is dependent on the applied gate voltage ($V_{g1}$, $V_{g3}$, $V_{g5}$, $V_{g7}$) for the approaches of FIGS. 3-5, 6-8, 9-12, and 13-15 respectively (it is noted that the programming voltage $V_{pg1}$ remains constant at 2.0 volts in each of the approaches). In fact, it will be seen that providing a higher gate voltage determines a lower-resistance on-resistance characteristic. That is, in the specific examples set forth above, providing successively higher gate voltages $V_{g1}$, $V_{g3}$, $V_{g5}$, $V_{g7}$ in programming results in successively lower resistance on-state resistance characteristics (E, H, M, Q)

Figure 15:
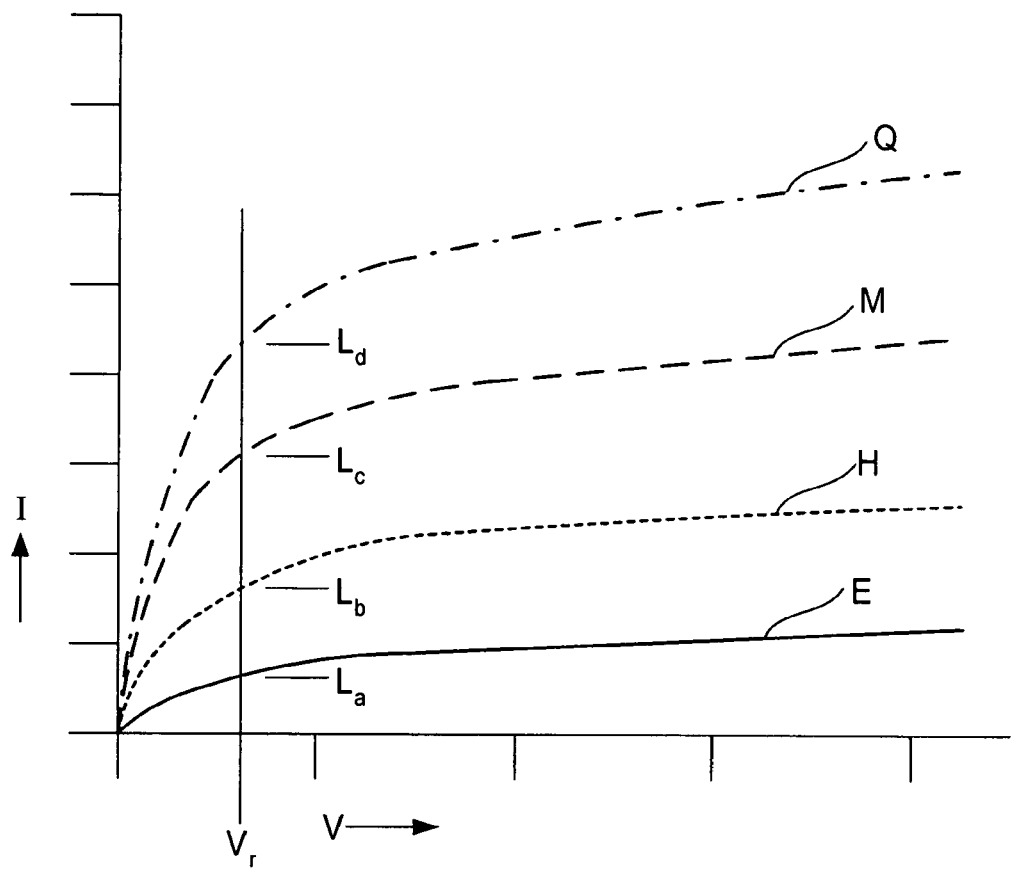
FIG. 15 is a plot of current (I) vs. voltage (V) illustrating the various on-resistance characteristics of the device in its various states, and the reading thereof.

FIG. 15 is a composite of FIGS. 5, 8, 11 and 14 illustrating the various on-resistance states (E, H, M, Q) of the memory device 130 in a single Figure. As noted above, each different above-described approach results in and determines a corresponding, different on-resistance characteristic of the memory device 130. With a read voltage $V_r$ (lower in magnitude than $V_{pg1}$ and $V_{er1}$) applied to the electrode 136, the level of current through the memory device 130 will be determined by the particular on-resistance characteristic. As illustrated, the on-resistance characteristic (E) provides a current level $L_a$, the on-resistance characteristic (H) provides a current level $L_b$, the on-resistance characteristic (M) provides a current level $L_c$, and the on-resistance characteristic (Q) provides a current level $L_d$, with $L_d > L_c > L_b > L_a$.

In the present example, the memory device 130 is shown and described as adopting any one of four distinct, individual states. As described above, these four different states of the memory device 130 can provide two bits of information.

It will be understood that the difference in gate voltage level when programming the memory device 130 can be set more closely than in the present example, so that the memory device 130 would be capable of adopting more than four individual states.

Figure 16:
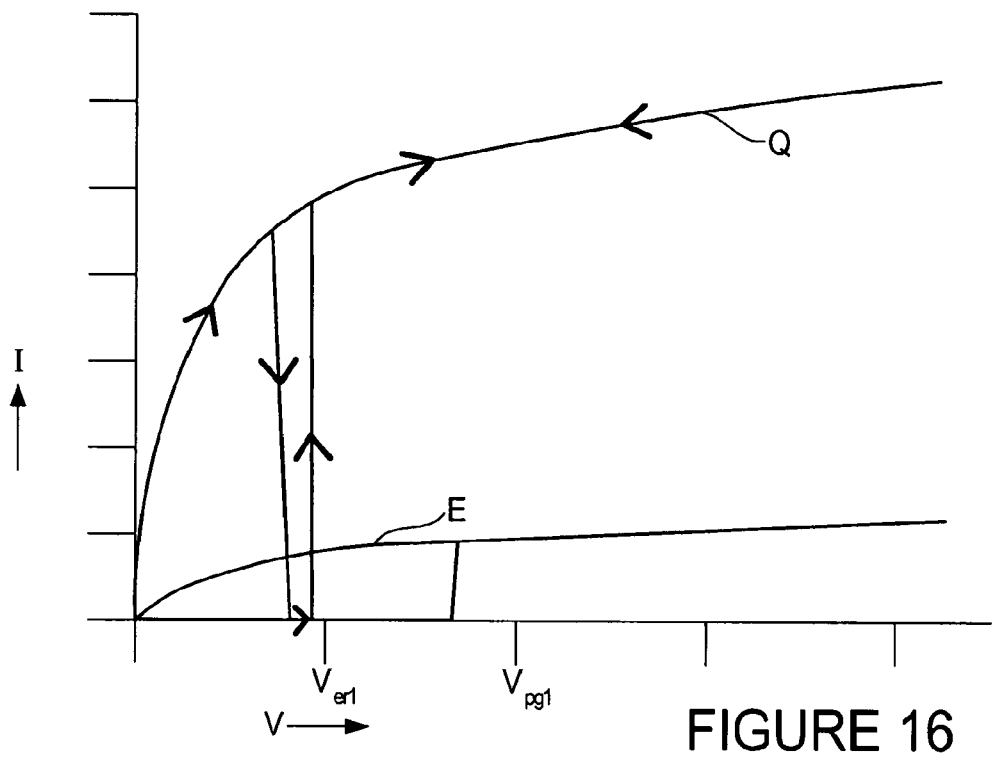
FIGS. 16 and 17 illustrate a repair process for a failed erase of the memory device.
Figure 17:
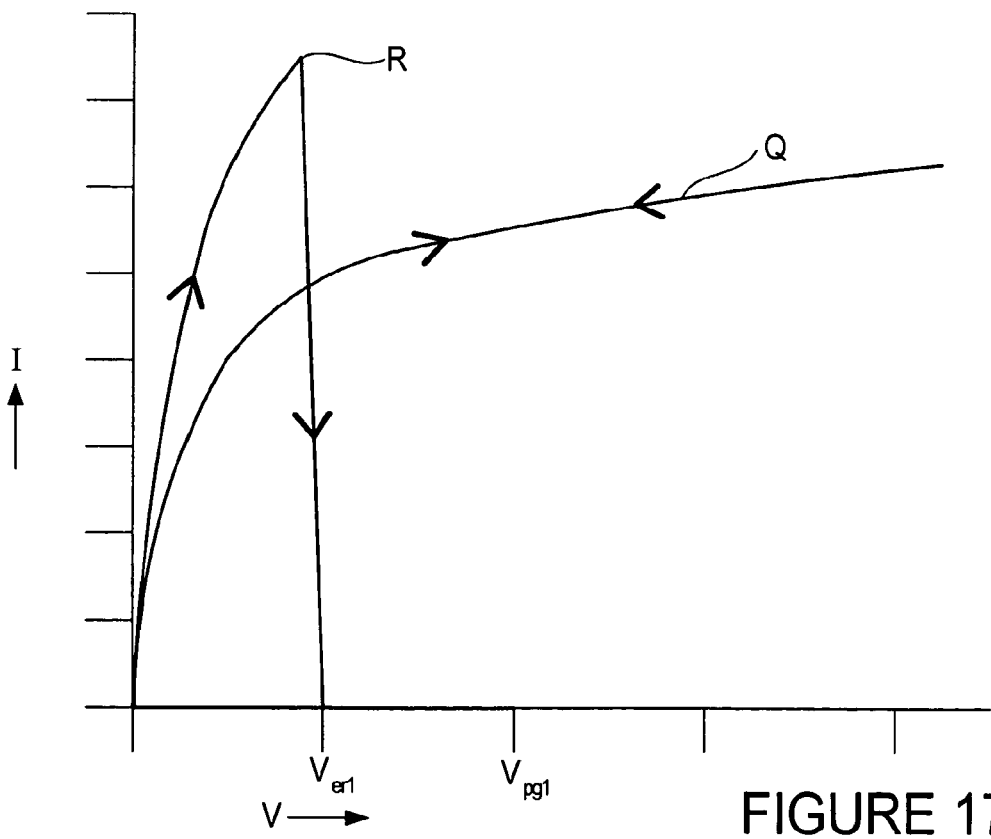

FIGS. 16 and 17 show plots of current (I) vs. voltage (V). FIGS. 16 and 17 illustrate a repair process in the event that a memory device 130 is improperly erased. Assuming that programming has been undertaken in a manner similar as described above with relation to FIGS. 3 and 5, i.e., $V_{pg1}$=2.0 volts, $V_{g1}$=1.0 volts, the on-resistance characteristics (E) is provided. Then, as described above with regard to FIGS. 4 and 5, in the erasing step, i.e., $V_{er1}$=1.0 volt is applied to electrode 136, and $V_{g1}$=1.8 volts is applied to the gate of the transistor 138. However, it may happen that for a variety of reasons, an erase malfunction occurs and instead of being erased the memory device 130 is reprogrammed based on the voltage applied to the gate of the transistor 138 during this attempted erase step. The resulting on-resistance characteristic would be as that shown in FIG. 14 (Q). When the improper erasing is realized upon a subsequent read step (indicating a current level that would be expected when taking the programming approach of FIGS. 12 and 14), the erase step next undertaken is as that described above in relation to FIGS. 13 and 14, i.e., the erase approach is based on having programmed the memory device 130 with the on-resistance characteristics (Q), which in fact undesirably occurred. Using this approach, an improperly erased memory device can be properly erased in a later step.

FIG. 18 illustrates a system 200 utilizing memory devices as described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 19 illustrates another system 300 utilizing memory devices as described above. The system 300 includes a vehicle 302 having an engine 304 controlled by an electronic control unit 305. The electronic control unit 305 with advantage uses memory devices of the type described above for data storage, for example data relating to engine and vehicle operating conditions.

Figure 20:
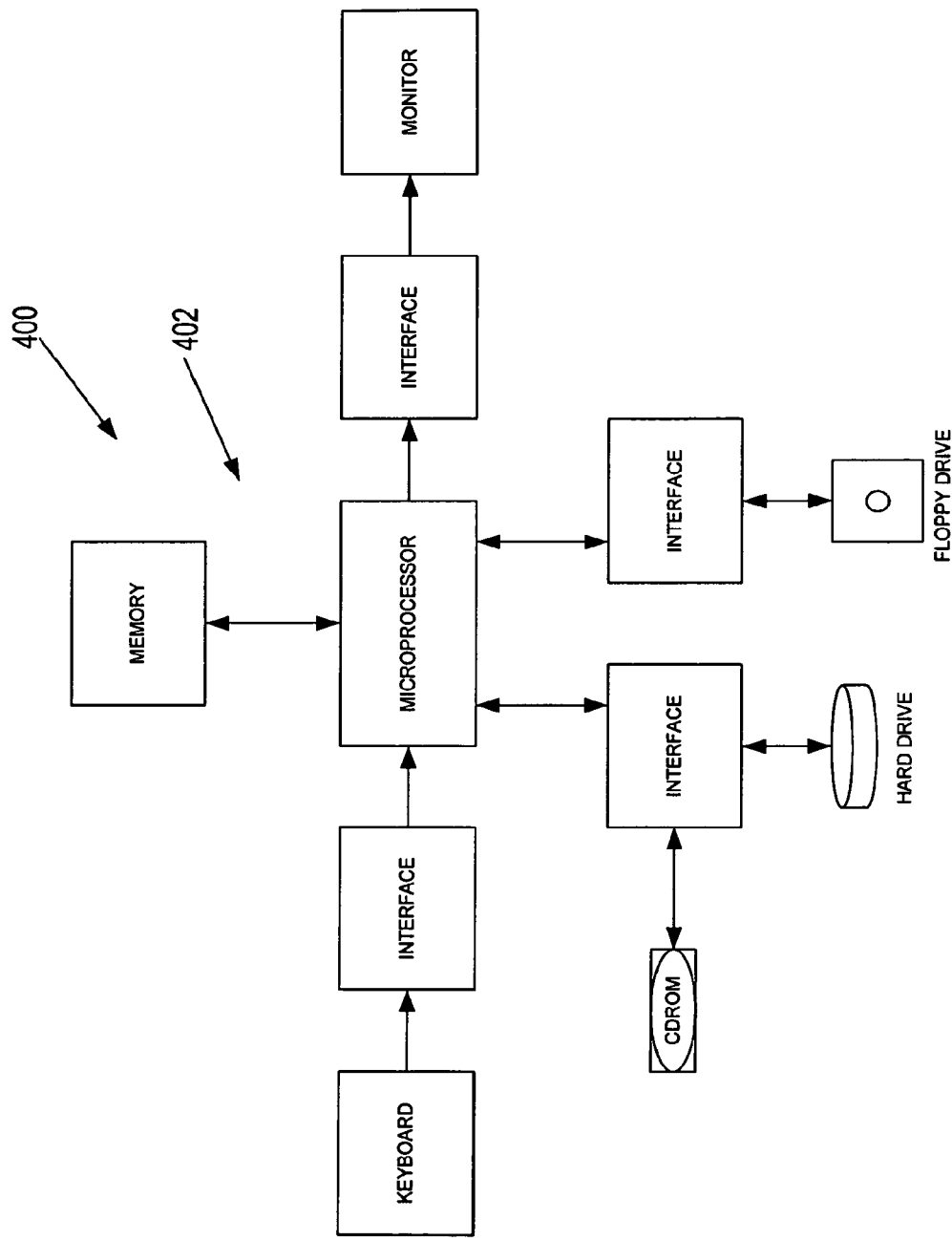

FIG. 20 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A method of repairing a memory device, comprising:
   determining an erase process performed on the memory device is unsuccessful; and
   performing a repair process to place the memory device in an erased state, wherein said performing the repair process includes:
   determining a programmed state of the memory device resulting from the erase process, and
   performing a subsequent erase process dependent on the programmed state.

2. The method of claim 1, wherein said determining the erase process performed on the memory device is unsuccessful includes:
   reading a memory state of the memory device; and
   detecting an unexpected current level.

3. The method of claim 1, wherein the programmed state is based on a voltage applied, during the erase process, to a gate of a transistor in series with the memory device.

4. The method of claim 3, wherein the memory device comprises first and second electrodes and a switching layer between the first and second electrodes.

5. The method of claim 3, wherein the memory device includes a plurality of selectable conductive on-resistance states.

6. The method of claim 5, wherein a selected one of the plurality of selectable conductive on-resistance states of the memory device is determined by a selected voltage applied to the gate of the transistor.

7. The method of claim 6, wherein the selected one of the plurality of selectable conductive on-resistance states provides one of a plurality of programmed states of the memory device, and wherein each programmed state of the memory device corresponds to one of the selectable conductive on-resistance states.

8. A method of repairing a memory device, comprising:
   performing a first erase process on a memory device to erase a first programmed state;
   after performance of the first erase process, determining a memory state of the memory device; and
   if the memory state is a second programmed state, performing a repair process to place the memory device in an erased state.

9. The method of claim 8, wherein said performing the repair process includes:
   performing a second erase process dependent on the second programmed state.

10. The method of claim 8, wherein said determining the memory state of the memory device includes:
    reading the memory state of the memory device; and
    detecting an unexpected current level.

11. The method of claim 8, wherein the second programmed state is based on a voltage applied, during the first erase process, to a gate of a transistor in series with the memory device.

12. The method of claim 11, wherein the memory device comprises first and second electrodes and a switching layer between the first and second electrodes.

13. The method of claim 11, wherein the memory device includes a plurality of selectable conductive on-resistance states.

14. The method of claim 13, wherein a selected one of the plurality of selectable conductive on-resistance states of the memory device is determined by a selected voltage applied to the gate of the transistor.

15. The method of claim 14, wherein the selected one of the plurality of selectable conductive on-resistance states provides one of a plurality of programmed states of the memory device, and wherein each programmed state of the memory device corresponds to one of the selectable conductive on-resistance states.

16. A method of repairing a memory device, comprising:
  reading the memory device and detecting an unexpected conductive on-resistance state corresponding to the memory device being programmed with a first voltage applied, during a previous attempt to erase the memory device, to a gate of a transistor in series with the memory device;
  erasing the memory device by applying a second voltage higher than the first voltage to the gate of the transistor; and
  reading a memory state of the memory device.

17. The method of claim 16, wherein the memory device comprises first and second electrodes and a switching layer between the first and second electrodes.

18. The method of claim 16, wherein the memory device includes a plurality of selectable conductive on-resistance states.

19. The method of claim 18, wherein a selected one of the plurality of selectable conductive on-resistance states of the memory device is determined by a selected voltage applied to the gate of the transistor.

20. The method of claim 19, wherein the selected one of the plurality of selectable conductive on-resistance states provides one of a plurality of programmed states of the memory device, and wherein each programmed state of the memory device corresponds to one of the selectable conductive on-resistance states.

\* \* \* \* \*